United States Patent [19]
Tsuji et al.

[11] Patent Number: 5,758,193
[45] Date of Patent: May 26, 1998

[54] INTERFACE FOR CONNECTING TERMINAL DEVICE MAINFRAME TO PLURAL KINDS OF SWITCH UNITS HAVING DIFFERENT NUMBERS OF SWITCHES THEREIN

[75] Inventors: Toshiyuki Tsuji; Tokio Ozaki, both of Kyoto, Japan

[73] Assignee: Omron Corporation, Kyoto, Japan

[21] Appl. No.: 853,728

[22] PCT Filed: Nov. 28, 1990

[86] PCT No.: PCT/JP90/01542

§ 371 Date: May 28, 1992

§ 102(e) Date: May 28, 1992

[87] PCT Pub. No.: WO91/08533

PCT Pub. Date: Jun. 13, 1991

[30] Foreign Application Priority Data

Nov. 28, 1989 [JP] Japan .................. 1-308151

[51] Int. Cl.$^6$ ........................................ G06F 3/02
[52] U.S. Cl. .................. 395/884; 395/887; 395/527; 341/22
[58] Field of Search .................. 395/275, 325, 395/500; 340/711; 341/22, 26

[56] References Cited

U.S. PATENT DOCUMENTS

| | | | |
|---|---|---|---|
| 3,883,867 | 5/1975 | Hatano et al. | 341/22 |
| 4,456,972 | 6/1984 | Lee et al. | 345/169 |
| 4,459,581 | 7/1984 | Wilson et al. | 341/23 |
| 4,626,830 | 12/1986 | Noens et al. | 341/22 |
| 4,706,068 | 11/1987 | Eberhard | 341/26 |
| 4,897,807 | 1/1990 | Ohsawa | 364/707 |
| 5,121,472 | 6/1992 | Danish et al. | 395/887 |
| 5,144,567 | 9/1992 | Oelsch et al. | 361/680 |

FOREIGN PATENT DOCUMENTS

| | | |
|---|---|---|
| 0 088 534 | 9/1983 | European Pat. Off. . |
| 0 119 293 | 9/1984 | European Pat. Off. . |
| 58-75239 | 5/1983 | Japan . |
| 58-191032 | 11/1983 | Japan . |
| 60-263222 | 12/1985 | Japan . |
| 62-174821 | 1/1986 | Japan . |
| 62-117636 | 7/1987 | Japan . |
| 62-222321 | 9/1987 | Japan . |
| 1-108624 | 10/1987 | Japan . |
| 62-229419 | 10/1987 | Japan . |
| 63-39743 | 3/1988 | Japan . |
| 63-173114 | 7/1988 | Japan . |
| 2-004030 | 1/1990 | Japan . |

OTHER PUBLICATIONS

Patent Abstracts of Japan, vol. 012, No. 436, Nov., 1988, p–787, JP 63–165914.
Patent Abstracts of Japan, vol. 012, No. 136, Apr., 1988, p–694, JP 62–257514.

*Primary Examiner*—Parshotam S. Lall
*Assistant Examiner*—Viet Vu
*Attorney, Agent, or Firm*—Foley & Lardner

[57] ABSTRACT

A terminal device is constituted by a terminal device main frame (2), which has a key input circuit (21), and a switch unit (3) connected to the main frame via connectors (4, 5) in a freely attachable and detachable manner. A number n of switch-signal input terminals (41~4n) provided in the key input circuit (21) is equal to or greater than a number N of switches (11~1N) provided in the switch unit (3) (n≧N). The switch unit (3) is provided with a generator (6) for generating a signal which designates the number N when the number N of switches is set. The switch-number designating signal is applied to the key input circuit (21). From among the input terminals (41~4n), the CPU (22) of the terminal device main frame accepts switch signals only from the input terminals of number N designated by the switch-number designating signal. Thus, switch units of a plurality of types having different numbers of switches can be used upon being connected to a single terminal device main frame.

5 Claims, 7 Drawing Sheets

ADDRESS TABLE

| IDENTIFICATION CODE | KEY TABLE ADDRESS |
|---|---|
|  |  |
|  |  |
|  |  |
|  |  |
|  |  |

Fig.6

KEY TABLE
IDENTIFICATION CODE

| KEY CODE | KEY FUNCTION |
|---|---|
|  |  |
|  |  |
|  |  |
|  |  |
|  |  |
|  |  |
|  |  |
|  |  |
|  |  |
|  |  |

INTERFACE FOR CONNECTING TERMINAL DEVICE MAINFRAME TO PLURAL KINDS OF SWITCH UNITS HAVING DIFFERENT NUMBERS OF SWITCHES THEREIN

TECHNICAL FIELD

This invention relates to a terminal device and a switch unit (inclusive of a keyboard) freely detachably connected to the terminal device for providing it with data (information, commands, etc.), as well as a data processing unit, a keyboard freely detachably connected to the data processing unit for providing it data, and an interface device for connecting the data processing unit and the keyboard.

BACKGROUND ART

Terminal devices and data processing units are provided with keyboards by which an operator furnishes them data (inclusive of commands). Since the keyboards for inputting data must be suited to the functions and capabilities of the terminal devices and with the data processing units provided with the keyboards, these keyboards usually are incompatible. Terminal devices and data processing units are, therefore, equipped with keyboards specific thereto.

The keyboards provided on or connected to terminal devices or data processing units of different types differ from one another first of all in the number of key switches they possess. The numbers of signal lines also differ, and the codes representing switch signals outputted from the operated key switches differ. In addition, keyboards connected in a freely attachable and detachable manner differ in terms of the shapes of their connectors (inclusive of the numbers of pins, the arrangement of the pins, etc.).

Both the maker and the user experience inconveniences owing to these facts. The maker must fabricate keyboards for the number of types of terminal devices or data processing units in use. Since the specifications of the keyboards differ depending upon their type, production of a wide variety of types is required. When terminal devices or data processing units of a plurality of different types have been installed, the keyboards thereof cannot be used in an interchangeable manner. In addition, when it becomes necessary to acquire the latest version of a control program for a terminal device or data processing unit and increase the number of function keys or the like, the user must purchase a new conforming keyboard.

An object of the present invention is to provide a terminal device to which switch units (inclusive of keyboards) of a plurality of types having different numbers of switches are capable of being connected.

Another object of the present invention is to provide a switch unit suited to the above-described terminal device and capable of being connected thereto.

A further object of the present invention is to provide a data processing unit to which keyboards of a plurality of types having different key arrangements and key functions, etc., are capable of being connected.

Still another object of the present invention is to provide a keyboard suited to the above-described data processing unit and capable of being connected thereto.

Yet another object of the present invention is to provide an interface device which makes it possible to connect keyboards of a plurality of types having different key arrangements, key functions and connector configurations to one type of data processing unit.

DISCLOSURE OF THE INVENTION

A terminal device according to the present invention is constituted by a terminal device main frame and a switch unit connected thereto by a connector in a freely attachable and detachable manner. The terminal device main frame has switch-signal input terminals of a first prescribed number, code-signal input terminals of a second prescribed number, and switch-signal accepting means for accepting a switch input signal applied to a predetermined input terminal among the switch-signal input terminals in dependence upon a code signal applied to the code-signal input terminals. The switch unit has switches the number of which is less than the first prescribed number, and code signal generating means for generating a code signal which represents correlation between the switches of the switch unit and the switch-signal input terminals of the terminal device main frame, and which comprises bits the number of which is the same as the second prescribed number. Output signals from the switches of the switch unit and the code signal generated by the code signal generating means are applied to the terminal device main frame via the connector.

The code generated by the code signal generating means represents the correlation between the switches provided on the switch unit and the switch-signal input terminals provided on the terminal device main frame. The code generating means is preset, so as to generate codes corresponding to the switches provided on the switch unit. When the switch unit is connected to the main frame of the terminal device, the switch signal accepting means of the terminal device reads, in accordance with the above-mentioned codes, the switch signals outputted by the switches of the switch unit and applied to the switch-signal input terminals. Accordingly, even if there are many types of switch units having different numbers of switches and any of these switch units has been connected to the main frame of the terminal device, the terminal device main frame is capable of reliably accepting the switch signals from the switches of the connected switch unit.

Thus, the maker need only provide one type of terminal device main frame to which switch units of a plurality of types are capable of being connected, and it is possible for the user to select a desired one of the switch units of plural types, connect it to a terminal device main frame of one type and utilize the switch unit.

A terminal device according to the invention has switch-signal input terminals of a first prescribed number, code-signal input terminals of a second prescribed number, and switch-signal accepting means for accepting a switch input signal applied to a predetermined input terminal among the switch-signal input terminals in dependence upon a code signal applied to the code-signal input terminals.

The terminal device is capable of being utilized, upon having any switch unit of a plurality of types of switch units upon being connected thereto.

The switch unit connected to the terminal device via the connector in a freely attachable and detachable manner has switches the number of which is less than the first prescribed number, and code signal generating means for generating a code signal which represents a correlation between the switches of the switch unit and the switch-signal input terminals of the terminal device, and which comprises bits the number of which is the same as the second prescribed number.

A terminal device according to the present invention is constituted by a terminal device main frame and a switch unit connected thereto by a connector in a freely attachable and detachable manner. The switch unit has a prescribed number of switches, and switch-number designating signal generating means for generating a switch-number designating signal which designates a number of the switches provided on the switch unit. The terminal device main body has switch-signal input terminals the number of which is equal to or greater than the prescribed number, switch-number designating signal input terminals, and switch signal accepting means for accepting a switch input signal applied to a predetermined input terminal among the switch-signal input terminals in dependence upon a switch-number designating signal applied to the switch-number designating signal input terminals.

In this terminal device also, any of plural types of switch units having different numbers of provided switches can be used upon being connected to a terminal 15 device of one type.

A switch unit according to the present invention has a prescribed number of switches, and switch-number signal generating means for generating a signal which represents this prescribed number.

The terminal device to which this switch unit is capable of being attachably and detachably connected via a connector has switch-signal input terminals the number of which is equal to or greater than the number of switches provided on the switch unit, switch-number signal input terminals, and switch signal accepting means for accepting a switch input signal applied to a predetermined input terminal among the switch-signal input terminals in dependence upon a switch-number signal applied to the switch-number signal input terminals.

A data processing system according to the present invention is constituted by a keyboard, a data processing unit main frame for executing predetermined processing in response to data provided by the keyboard, and an interface device for connecting the keyboard and the data processing unit main frame in a freely attachable and detachable manner. The interface device has converting means for converting a key switch signal provided by the keyboard connected thereto into a code signal which corresponds to the key switch signal and which is capable of being read by the data processing unit main frame, and identification code generating means for generating an identification code of the interface device. The data processing unit main frame has a correspondence table, which is provided to correspond to the identification code, for representing correlation between key switches of the keyboard and code signals provided by the interface device, and means which, when a code signal is provided by the interface device, recognizes the key switch corresponding to the code signal by referring to the table which corresponds to the identification code provided by the interface device.

The keyboard and the interface device corresponding thereto are used as a pair. A key switch signal outputted by the keyboard is converted into a code signal corresponding thereto and the code signal is applied to the data processing unit main frame from the interface device. The identification code set in the interface device is applied to the data processing unit main frame. The latter has a correspondence table which represents the correlation between key switches of the keyboard and code signals. The correspondence table is designated by the identification code of the interface device. Accordingly, when a code signal has been inputted from the interface device, the data processing unit main frame is capable of recognizing the key switch corresponding to the input code signal by referring to the correspondence table designated by the identification code provided by the interface device.

Thus, in accordance with the present invention, regardless of which keyboard of a plurality of types thereof having key arrangements, key types and key numbers that differ from one another is connected to a data processing unit main frame via the interface corresponding to the keyboard, the data processing unit main frame is capable of recognizing code signals generated by the keyboard and inputted via the interface device. Accordingly, the user is capable of using any desired keyboard among a plurality of types thereof by connecting the keyboard to a single data processing unit main frame.

An interface device according to the present invention for connecting, in a freely attachable and detachable manner, a keyboard and a data processing unit for executing predetermined processing in response to data provided by the keyboard, has converting means for converting a key switch signal provided by the keyboard connected thereto into a code signal which corresponds to the key switch signal and which is capable of being read by the data processing unit, and identification code generating means for generating an identification code of the interface device.

Any desired keyboard of a plurality of types thereof having key arrangements, key types, key numbers and connector configurations that differ from one another can be used upon being connected to a data processing unit using the interface device according to the invention.

A data processing system according to the present invention is constituted by a keyboard and a data processing unit main frame to which the keyboard is capable of being connected in a freely attachable and detachable manner, for executing predetermined processing in response to data provided by the keyboard. The keyboard has a plurality of key switches, converting means for converting a switch signal generated by an operated key switch into a code signal which corresponds to the switch signal and which is capable of being read by the data processing unit main frame, and identification code generating means for generating an identification code of the keyboard. The data processing unit main frame has a correspondence table, which is provided to correspond to an identification code, for representing correlation between key switches of the keyboard and code signals outputted by the keyboard in correspondence with the key switches, and means which, when a code signal is provided by the keyboard, recognizes the key switch corresponding to the code signal by referring to the table which corresponds to the identification code provided by the keyboard.

A key switch signal generated by an operated key switch on the keyboard is converted into a code signal which corresponds to the key switch signal, and the code signal is inputted to the data processing unit main frame. The identification code set in the keyboard is applied to the data processing unit main frame. The latter has the correspondence table which represents correspondence between the key switches of the keyboard and the code signals, and the correspondence table is designated by the identification code of the keyboard. Accordingly, when a code signal is inputted from the keyboard, the data processing unit main frame is capable of recognizing the key switch corresponding to the input code signal by referring to the correspondence table designated by the identification code applied by the keyboard.

Thus, in accordance with the present invention, regardless of which keyboard of a plurality of types thereof having key arrangements, key types and key numbers that differ from one another is connected to a data processing unit main frame, the data processing unit main frame is capable of recognizing code signals inputted from the keyboard. Accordingly, the user is capable of using any desired keyboard among a plurality of types thereof by connecting the keyboard to a single data processing unit main frame.

A keyboard according to the present invention has a plurality of key switches, converting means for converting a switch signal generated by an operated key switch into a code signal which corresponds to the switch signal and which is capable of being read by a data processing unit, and identification code generating means for generating an identification code of the keyboard.

A data processing unit according to the invention to which a plurality of the above-mentioned keyboards of different types are capable of being connected has a correspondence table, which is provided to correspond to the identification code, for representing correlation between key switches of the keyboard and code signals outputted by the keyboard in correspondence with the key switches, and means which, when a code signal is provided by the keyboard, recognizes the key switch corresponding to the code signal by referring to the table which corresponds to the identification code provided by the keyboard.

A data processing unit according to the present invention, to which one keyboard of a plurality of types thereof is capable of being connected in a freely attachable and detachable manner, for executing predetermined processing in response to a code signal outputted by the connected keyboard to correspond to a key switch of the keyboard when the key switch has been operated, comprises means, which is capable of being set to a classification code representing the type of keyboard connected, for generating a signal which represents the classification code set, correspondence tables, which are provided to correspond to respective ones of classification codes of a plurality of types, for representing correlation between key switches of the keyboard specified by the classification codes and code signals outputted by the keyboard in correspondence with the key switches, and means which, when a code signal is provided by the keyboard, recognizes the key switch corresponding to the code signal by referring to the table which corresponds to the classification code generated by the classification code signal generating means.

Preferably, the keyboard includes interface means which, when a key switch has been operated, is for converting a key switch signal outputted by this key switch into a code signal corresponding to the key switch signal.

The data processing unit according to the present invention is provided with means for generating a classification code which represents the type of keyboard connected. When any keyboard of a plurality of types thereof is connected to the data processing unit and used, if the classification code of the connected keyboard is set in the classification code generating means, the data processing unit selects the correspondence table based upon the classification code and is capable of recognizing the code signal, which is provided by the keyboard, by referring to the correspondence table. Thus, a desired keyboard among keyboards of a plurality of types having different key arrangements, key types and key numbers is capable of being selectively connected to the data processing unit and used by the user.

BRIEF DESCRIPTION OF THE DRAWINGS

FIGS. 1 through 3 illustrate a first embodiment of the present invention, in which:

FIGS. 4 through 7 illustrate a second embodiment of the present invention, in which:

BEST MODE FOR CARRYING OUT THE INVENTION

Figure 1:
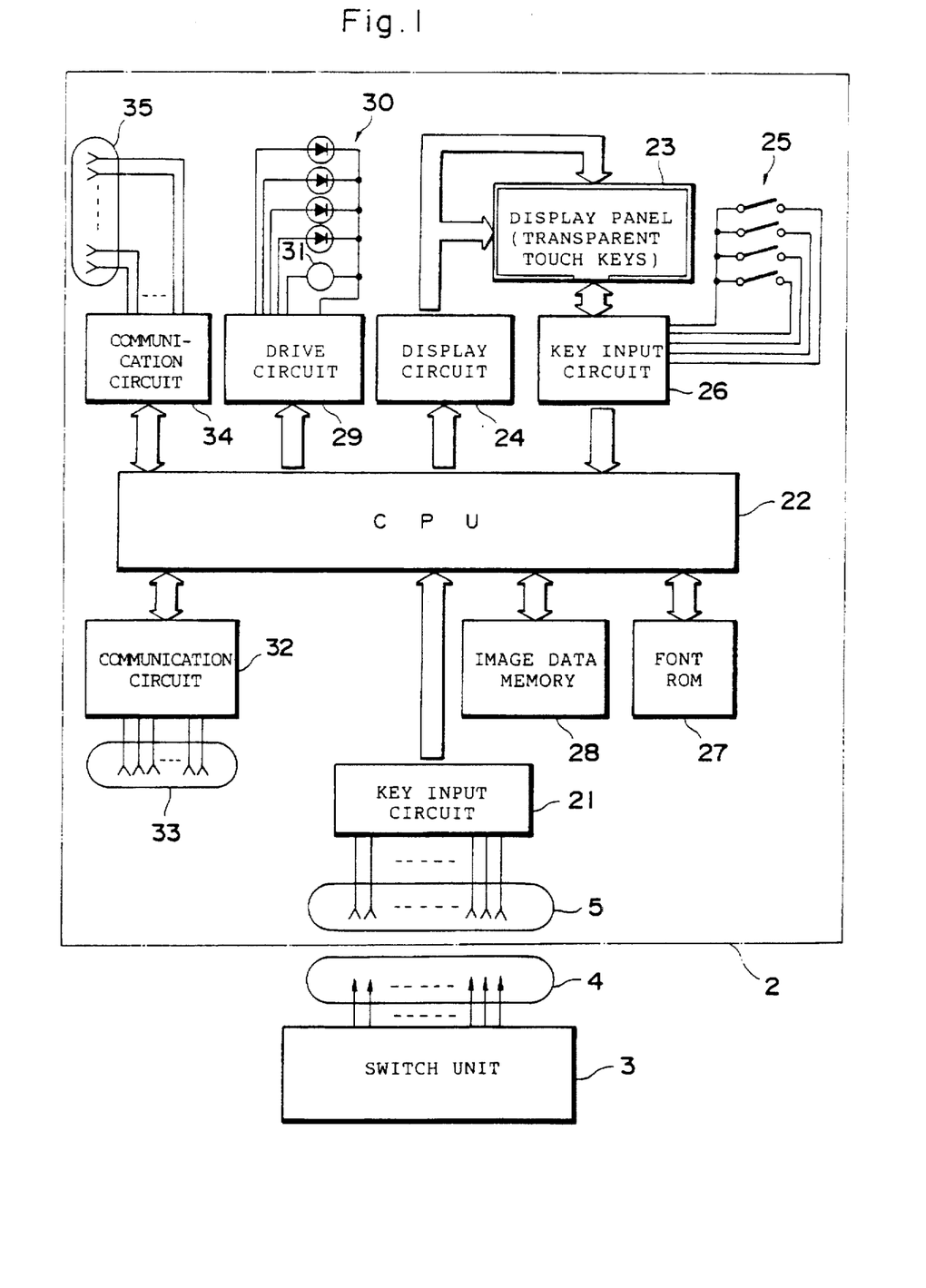
FIG. 1 is a block diagram illustrating the overall electrical construction of a terminal device.

FIG. 1, which illustrates a first embodiment of the present invention, is a block diagram showing the electrical construction of a terminal device.

The terminal device is constituted by a terminal device main frame 2 and a switch unit 3. The switch unit 3 includes a plurality (N) of operation switches, described later. The switch unit 3 is a keyboard, for example, in which case the operation switches are key switches. The switch unit 3 is provided with a connector 4. The terminal device main frame 2 also has a connector 5. The switch unit 3 is connected to the terminal device main frame 2 in a freely attachable and detachable manner by the connectors 4 and 5.

The terminal device main frame 2 has a key input circuit 21 for converting a switch signal inputted from the switch unit 3 via the connectors 4 and 5 into a code corresponding to the switch signal, a CPU 22 for reading the code signal converted by the key input circuit 21 and executing processing conforming thereto as well as processing for other overall control of the terminal device, a display panel 23 which includes transparent touch keys, a display circuit 24 for causing display data, which includes a function display of the touch keys provided by the CPU 22, to be displayed on the display panel 23, a group 25 of system switches provided on the front panel of the terminal device main frame 2, a key input circuit 26 for providing the CPU 22 with code signals corresponding to operated transparent touch keys and operated system switches, a ROM 27 which stores font data, an image data memory 28 for storing data representing an image displayed on the display panel 23, a display LED group 30, an alarm buzzer 31, a drive circuit 29 for driving the LED group and the buzzer, an external-device control communication circuit 32 for communicating with an externally provided device, connectors 33 for connecting input/output lines of the communication circuit 32 to the external device, a tool communication circuit 34 for communicating with a programming unit which sets, debugs and upgrades the version of the program of the CPU 22, and a connector 35 for connecting the tool communication circuit 34 to the programming unit. In the terminal device main frame 2, all components are well known with the exception of the key input circuit 21 and CPU 22, which will be described later. A detailed description of the known components will be avoided.

Figure 2:
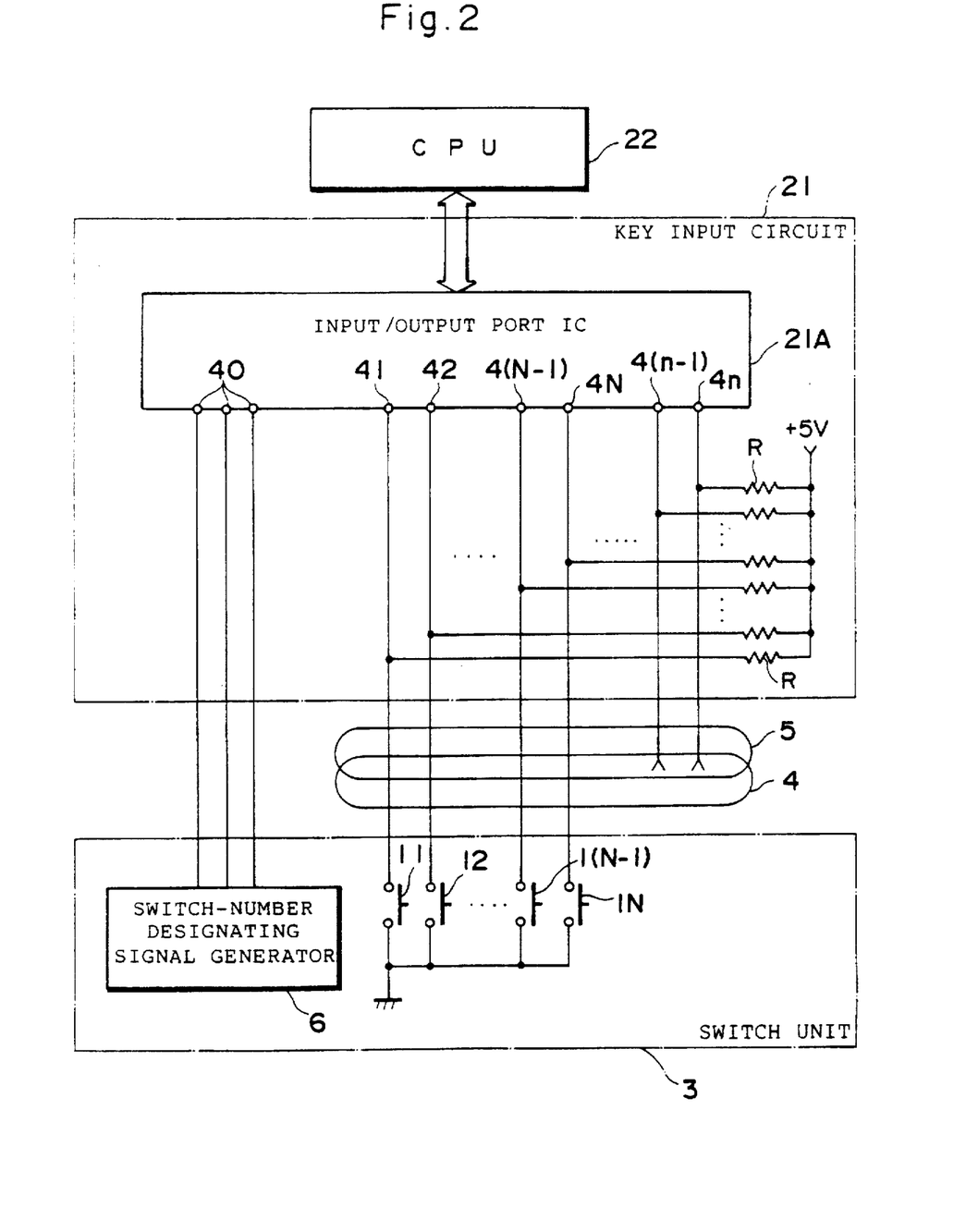
FIG. 2 is a circuit diagram illustrating a specific example of a switch unit and key input circuit in the terminal device shown in FIG. 1.

FIG. 2 illustrates a specific example of the construction of the switch unit 3 and the key input circuit 21 in the terminal device main frame 2.

The switch unit 3 is equipped with a predetermined N-number of switches 11, 12, . . . , 1N, as described above.

and with a switch-number designating signal generator 6. One terminal of each of the N-number of switches 11~1N is connected to ground (the low level, hereinafter referred to as the "L level"). The switch number designating signal generator 6 generates a code signal which represents the number of switches provided in the switch unit 3. For example, the signal generator 6 is constituted by a suitable number (three in this embodiment) of dip switches.

The key input circuit 21 includes an input/output port IC 21A. The input/output port IC 21A includes three input terminals 40 for inputting the switch-number designating signal, and n-number of input terminals 41, 42, . . . , 4N, . . . , 4n for inputting the switch signals. The number n of the input terminals for inputting the switch signals is equal to or greater than the number N of switches 11~1N provided in the switch unit 3 (n≧N).

When the switch unit 3 has been connected to the terminal device main frame 2 by the connectors 4 and 5, the output lines of the switch-number designating signal generator 6 of the switch unit 3 are connected to the input terminals 40 of the input/output port IC 21A. The other terminals of the switches 11~1N of the switch unit 3 are respectively connected to the corresponding input terminals 41~4N of the input/output port IC 21A. The key input circuit 21 further includes n-number of pull-up resistors R. The input terminals 41~4n are connected to a +5 V power supply (the high level, hereinafter referred to as the "H level") via corresponding ones of the resistor R.

Accordingly, when all of the switches 11~1N of the switch unit 3 are off, the input terminals 41~4N of the input/output port IC 21A are at the H level. The input terminals corresponding to switches among the switches 11~1N that have been turned on fall to the L level. Input terminals [4(N+1)~4n] of the input/output port IC 21A, which are terminals other than the input terminals 41~4N, are maintained at the H level at all times.

To cite a specific example of the number n of input terminals 41~4n and the number N of switches 11~1N, n=64 may be selected, in which case the number N would be selected to be N=64, 48 or 32, etc. The number N of switches can be decided by the maker who manufactures the switch unit 3, or the user who has purchased the switch unit 3 can set N at will by increasing or decreasing the switches. The maker need manufacture only one type of switch unit, or switch units of a plurality of types in which the number N of switches differs may be manufactured.

In any case, when the number N of switches in the switch unit 3 has been decided, the code representing the number N is set in the switch-number signal generator 6. For example, by operating the three dip switches of the generator 6, a switch-number designating code is set in such a manner that the code signal outputted by the generator 6 represents 000 in case of N=32 and 001 in case of N=64.

The switch-number designating code enters the input terminals 40 of the input/output port IC 21A, and the CPU 22 reads this signal. Among the input terminals 41~4n, the CPU 22 scans the number of input terminals designated by the code, thereby judging whether the switches 11~1N of the switch unit 3 are in the on or off state. In this embodiment, it will be assumed for the sake of simplicity that N-number of input terminals 41~4N are scanned from the left end of the input/output port IC 21A in FIG. 2. If there is an input terminal found to be at the L level by scanning, then it is determined that the switch corresponding to this input terminal is on. The (n-N)-number of input terminals not scanned are always at the high level, and therefore even if these terminals are scanned mistakenly, the corresponding switches (though there are none here) will not be judged to be on.

It will suffice to scan the input terminals connected to the switches of the switch unit 3. For example, if the switches 11~1N have been connected to the N-number of input terminals counting from the right end of the input/output portion IC 21A, then these input terminals will be object of scanning processing. If the switches of the switch unit 3 have been connected to every other one of the input terminals of the input/output portion IC 21A, then these connected input terminals are scanned. In any case, the number of input terminals scanned and the pattern of the array are specified by the switch-number designating code signal.

There are occasions where the switch unit 3 includes indicator lamps provided to correspond to the switches 11~1N. It is permissible to adopt an arrangement in which one-bit data indicating whether the switch unit has been equipped with these indicator lamps is incorporated in the switch-number designating code. The indicator lamp corresponding to a switch that has been turned on lights. An arrangement may be adopted in which the switch unit 3 is internally provided with a relay circuit actuated by the output of the switch turned on, in which case the indicator lamp would be lit by the relay circuit. Alternatively, since the CPU 22 is capable of recognizing the on switch by virtue of the foregoing scanning processing, an arrangement may be adopted in which the code signal representing this switch is generated by the input/output port IC 21A and the code signal is applied to the switch unit via a connector. The switch unit may be provided in advance with a circuit which lights the corresponding indicator lamp in response to this code signal.

Figure 3:
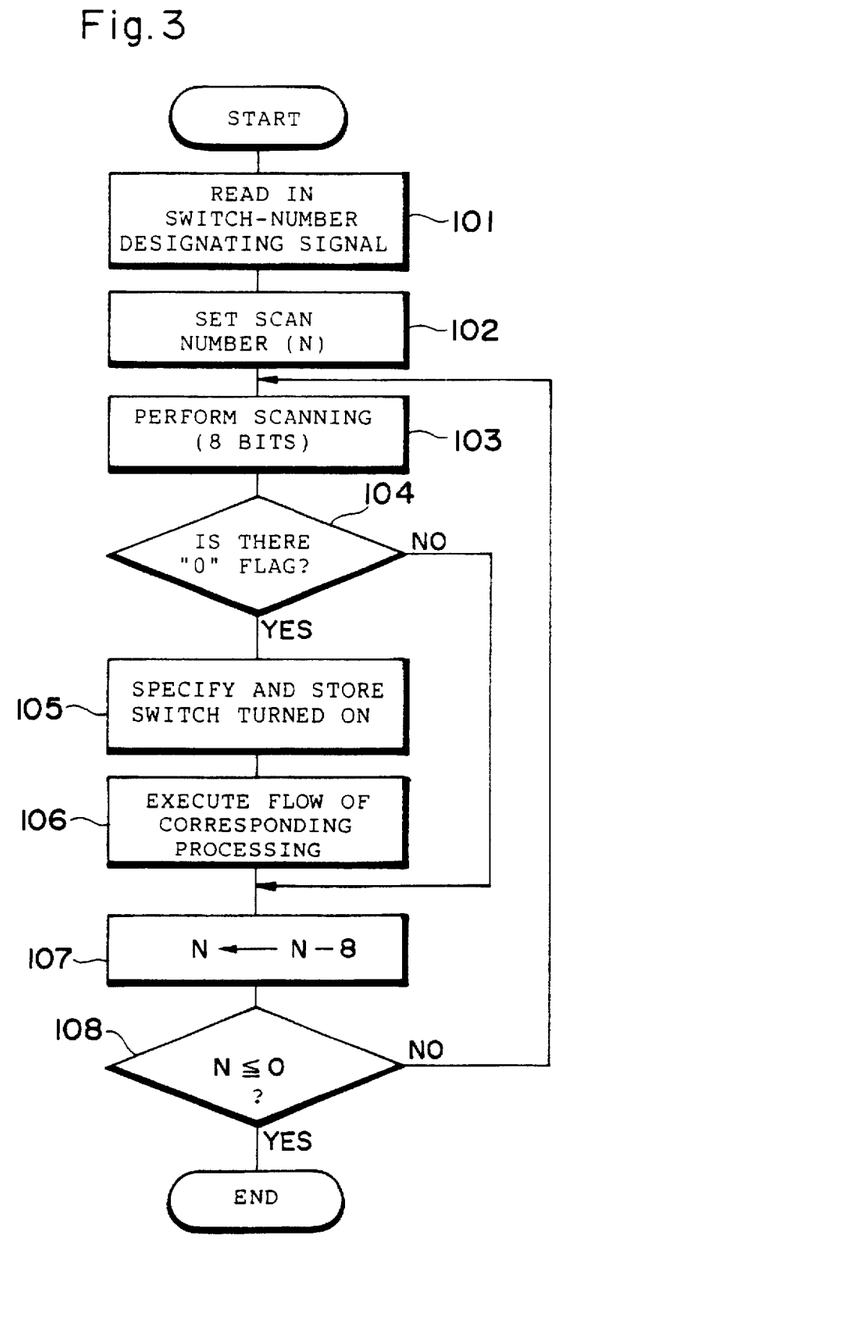
FIG. 3 is a flowchart illustrating an outline of a processing procedure through which a CPU of the terminal device discriminates the on and off states of switches in the switch unit.

FIG. 3 illustrates an outline of a processing procedure through which the CPU 22 within the terminal device main frame 2 discriminates the states of the switches in the switch unit 3 connected to the terminal device.

The first step is to read in (step 101) the switch-number designating code set in the switch-number designating signal generator 6 and applied to the input terminals 40 of the input/output port IC 21A via the connectors 4 and 5. The CPU 22 analyzes the code and discriminates the number N of switches in the switch unit 3 and the positions (the input-terminal numbers) of the input terminals (the N-number of terminals among the terminals 41~4n) connected to these switches (step 102). As a result, among the input terminals 41~4n, the number and the positions of the input terminals to be scanned are decided.

The input/output port IC 21A is provided with memory elements (flip-flops, for example) to correspond to respective ones of the input terminals 41~4n. If the signal inputted to the corresponding input terminal is at the H level, then a flag that is represented by the state of the memory element is set to "1". If the signal is at the L level, then the flag is reset to "0".

The CPU 22 executes scanning processing in such a manner that the N-number of input terminals to be scanned are scanned in groups of eight. The first eight input terminals are scanned (step 103) and it is determined (step 104) whether there is a flag among these eight terminals that has been reset to "0". If there is no "0" flag, 8 is subtracted from N (step 107) and then scanning processing is applied to the flags of the next eight bits (steps 107, 103). If, by repeating the scanning in groups of eight bits at a time as well as the processing for subtracting 8 from N, the result of subtraction is that N is 0 or negative, then all processing is ended (step 108).

When a "0" flag is determined to exist at step 104, whichever input terminal (the number of the input terminal) is associated with the "0" flag has its terminal number specified, and this is stored in memory (step 105). Since the switch turned on in the switch unit 3 is specified, the processing corresponding to this switch is carried out (step 106).

For example, in a case where the terminal device has been connected to a host computer (e.g., a programmable controller), the terminal device sends the code representing the on switch to the host computer. Upon receiving the code, the host computer decides the processing to be executed in conformity with the on switch and sends a command representing the results of the decision to the terminal device. Upon receiving this command, the terminal device executes processing corresponding to the command, e.g., processing for presenting a prescribed display on the display panel 23.

In the processing of FIG. 3, it goes without saying that absolutely no scanning processing for input terminals not connected to the switches of the switch unit is executed.

Figure 4:
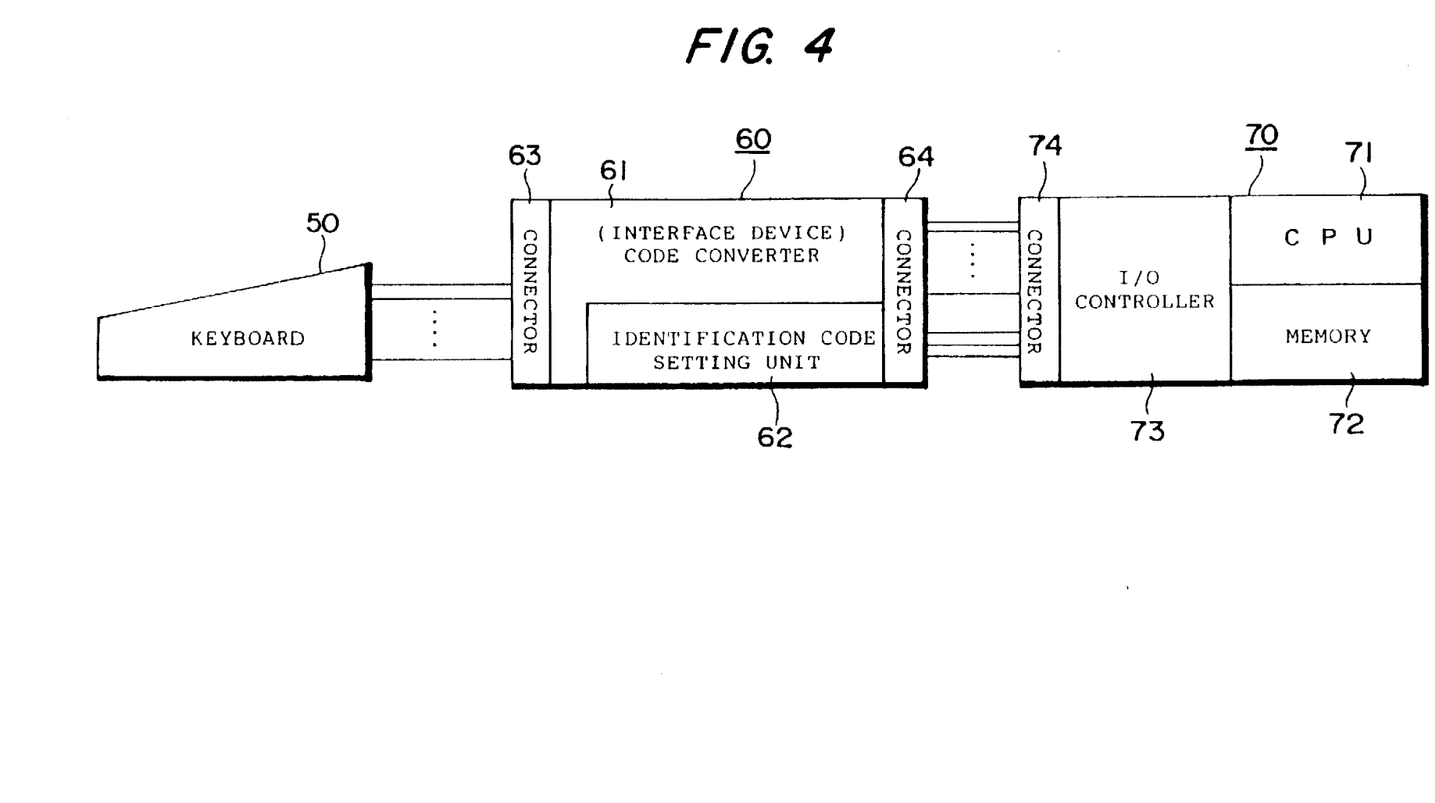
FIG. 4 is a block diagram illustrating the overall electrical construction of a data processing system.

FIG. 4, which illustrates a second embodiment of the present invention, is a block diagram showing the overall electrical construction of a data processing system.

The data processing system is constituted by a keyboard 50, an interface device 60 and a data processing unit main frame 70.

The keyboard 50 includes numeric keys, alphabetic keys and function keys. The keyboard 50 is connected in a freely attachable and detachable manner to the interface device 60 via a connector 63. The interface device 60 is connected dn a freely attachable and detachable manner to the data processing unit main frame 70 via connectors 64 and 74. In general, keyboards 50 of a plurality of types usable by a data processing unit main frame 70 of one type can exist. The numbers of keys and the functions of these keys differ in such keyboards of a plurality of types. Interface devices of a plurality of types exist for corresponding ones of the various types of keyboards. A keyboard and its corresponding interface device constitute a pair.

The interface device 60 includes a code converter 61 and an identification code setting unit 62. A key switch signal representing a key pressed on the keyboard 50 is inputted to the interface device 60 via the connector 63 through a line corresponding to this key or, alternatively, upon being converted into a code representing the key pressed on the keyboard. The interface device 60 converts the key switch signal or the key code signal provided by the keyboard 50 into a code capable of being read by the data processing unit main frame 70 and sends this code to the data processing unit main frame 70 via the connectors 64 and 74. The identification code setting unit 62 of the interface device 60 is for setting the identification code of this interface device (or of the keyboard forming a pair with and connected to this interface), and is constituted by a plurality of dip switches, by way of example. The identification code setting unit 62 can also be constituted by a ROM in which the identification code has been stored. The identification code is sent to the data processing unit main frame 70 via the connectors 64 and 74. The identification code may be set by the maker which manufactures the interface device 60 and the keyboard or by the user employing them.

The data processing unit main frame 70 is constituted by a CPU 71, a memory 72, an I/O controller 73 and a display device (not shown). The code signal representing the pressed key and the identification code signal, which are sent from the interface device 60, are read in by the CPU 71 through the I/O controller 73, and these signals are interpreted by referring to an address table and a key table illustrated below.

Figure 5:
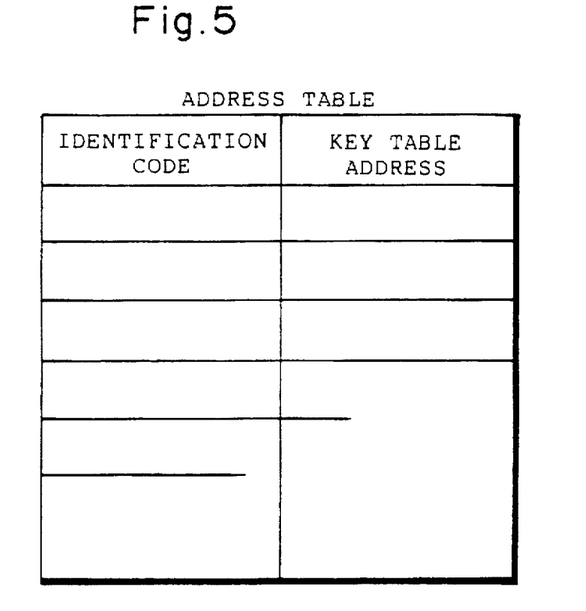
FIG. 5 illustrates an address table.
Figure 6:
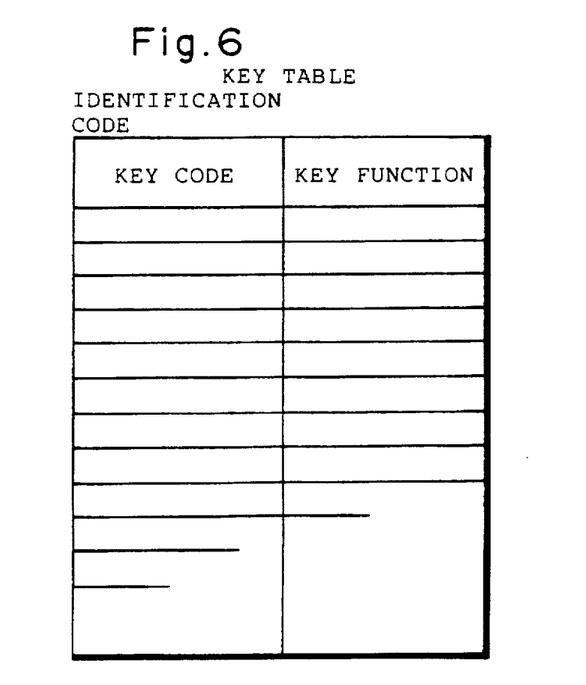
FIG. 6 illustrates a key table.

FIGS. 5 and 6 illustrate the address table and the key table, respectively. These tables are stored in the memory 72.

The address table stores, in correspondence with identification codes set in interface devices of plural types, the addresses (e.g., the beginning addresses) of storage areas in the memory 72 which store the key tables of the interface devices (and of the keyboards which form pairs with these interface devices).

A key table is provided for each identification code. The key table stores, in correspondence with the codes (also referred to as key codes here) representing the pressed keys sent from the interface device, the meanings (functions) of the keys on the keyboard forming the pair with the interface device. The meaning of a key expresses the classification of the key, such as a numeric key, alphabetic key or function key, as well as its content (e.g., a numeral such as 1, 2 or 3 in case of a numeric key, the type of alphabet, a, b, c, A, B, C, etc., in case of an alphabetic key, or contents of function, etc., in case of a function key).

Figure 7:
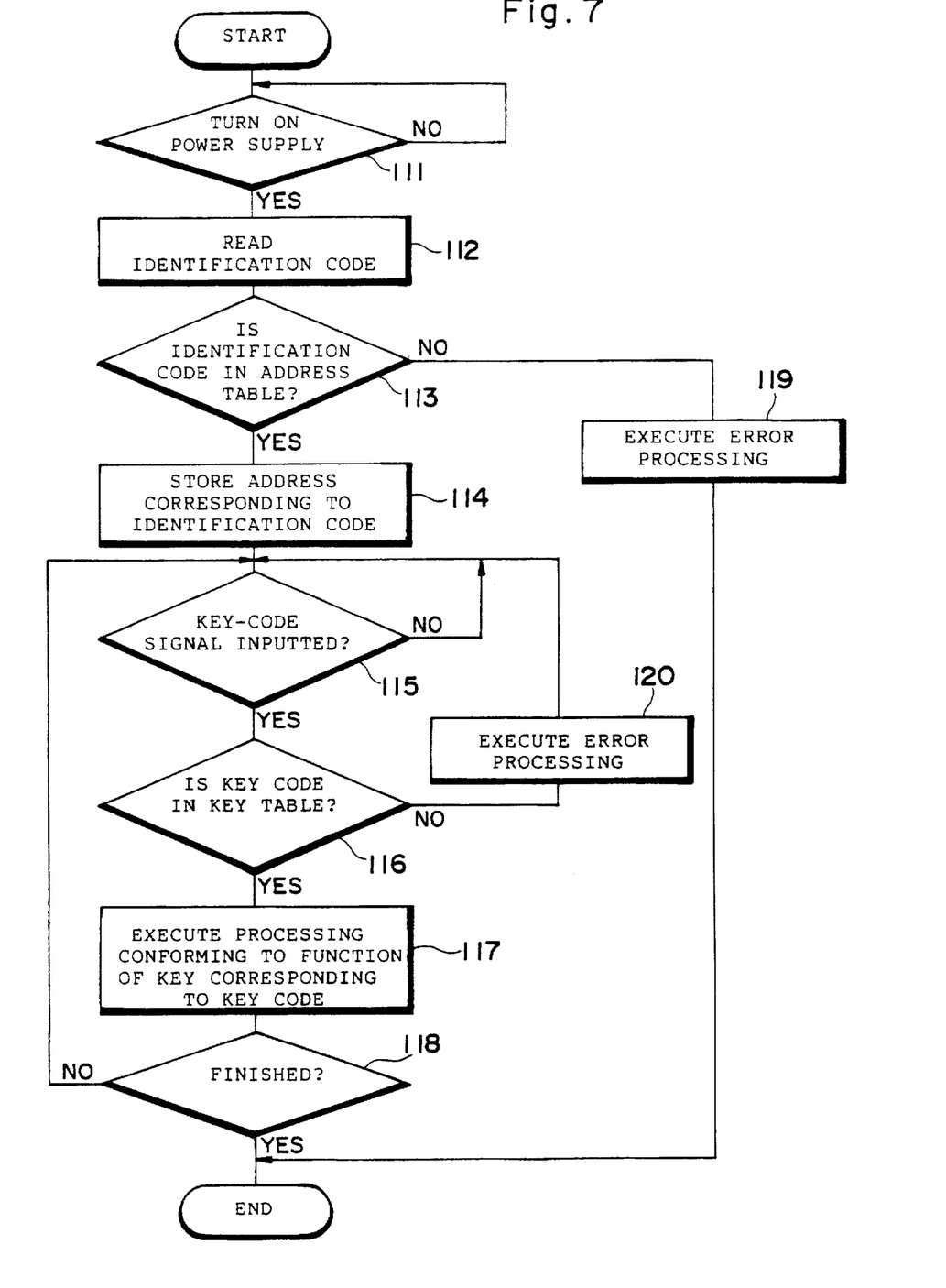
FIG. 7 is a flowchart illustrating the procedure of key reading processing executed by a CPU in the main frame of the data processing unit.

FIG. 7 is illustrates the procedure of key reading processing executed by the CPU 71 in the data processing unit main frame 70.

If the interface device 60 has been connected when the power supply of data processing unit main frame 70 is turned on (step 111), the identification code set in the identification code setting unit 62 of the interface device 60 is read (step 112) and it is determined whether this identification code exists in the address table (step 113). If the identification code read from the interface device 60 is present in the address table, then the address of the key table corresponding to identification code is read out and stored (step 114).

When the keyboard 50 is operated, the key code representing the operated key is sent from the interface device 60 (step 115), as mentioned above.

The key table designated by the address read out of the address table and stored is retrieved and it is determined whether the sent key code has been registered in the key table (step 116). If the sent key code is present in the key table, the function of this code is comprehended and therefore processing conforming to the function of this key is carried out within the data processing unit main frame 70 (step 117).

The processing of steps 115~118 is repeatedly executed until a series of key operations ends (step 118). In a case where a key code indicative of the fact that processing has ended is received or a case where the power supply is turned off, or when it is judged that the system processing has ended, all processing ends.

In a case where the identification code read from the interface device 60 does not exist in the address table, or in a case where the received key code does not exist in the key table, error processing is executed (steps 119, 120), such as by presenting a display to this effect on the display device, by sounding the buzzer, etc. If the identification code does not exist in the address table, then any further processing is impossible. If the key code does not exist in the key table, it is possible to continue processing as by pressing a different key.

Thus, in accordance with this embodiment as set forth above, even if there are keyboards of a plurality of types and the number of keys provided on these keyboards as well as the types of keys differ, a desired one of the keyboard of plural types can be connected to the data processing unit main frame 70 and used if the address table and the key tables are created and stored in the memory 72 of the data processing unit main frame 70 in advance. In addition, even if the numbers of output lines of the keyboards and the connector configurations differ depending upon the type of keyboard, the interface device dedicated to each keyboard is connected to the keyboard and the data processing unit main frame is connected to the keyboard via the interface device. Therefore, as long as the connection between the interface device 60 and the data processing unit main frame is capable of being secured, all keyboards will be connectable to the data processing unit main frame.

An arrangement is feasible in which all of the functions of the interface device are incorporated in a keyboard and the interface device is deleted. In such case, the identification code of the keyboard would be set in the identification code setting unit. In addition, the addresses of the key tables would be stored in the address table in correlation with the identification codes.

Figure 8:
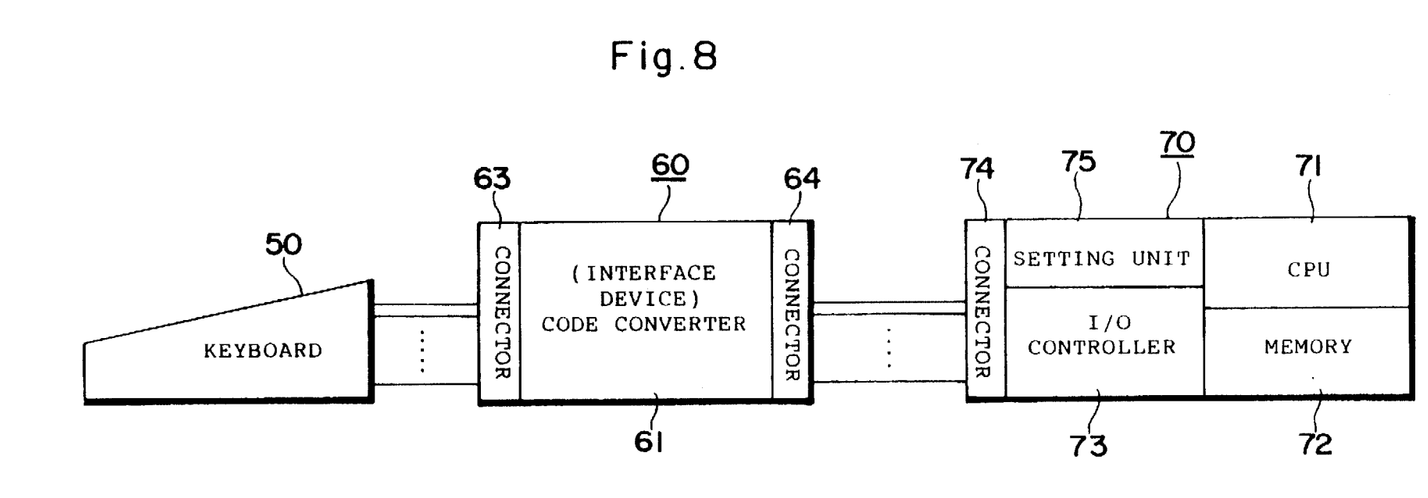
FIG. 8 is a block diagram illustrating a modification of the data processing system.

FIG. 8 illustrates a modification, in which portions identical with those shown in FIG. 4 are designated by like reference symbols and a description thereof is omitted.

In this modification, the data processing unit main frame 70 is provided with an identification code setting unit 75. When the user connects the keyboard 50 and the interface device 60 to the data processing unit main frame 70 to use them, the identification code of the interface device (or keyboard) used is set in the setting unit 75 on each such occasion.

In this modification also, the interface device can be incorporated within the keyboard.

A terminal device according to the present invention is such that a desired switch unit from among switch units of a plurality of types having different numbers of switches can be connected and used. A programmable controller, for example, can be connected to the terminal device and used as a host controller, so that the terminal device can be utilized for inputting and outputting data, commands and information for controlling a factory or various machines, or utilized as a work designating terminal in various operating processes at a factory.

A data processing unit according to the present invention is such that a desired keyboard from among keyboards of a plurality of types having different numbers and types of keys can be connected and used. The data processing unit can be utilized for various management and control operations in an office or factory, etc.

We claim:

1. A terminal device comprising:
   a terminal device main frame and a switch unit connectable to said terminal device main frame in a freely attachable and detachable manner through a connector adaptable for plural kinds of switch units and having switches the numbers thereof differing from one another;
   said terminal device main frame having:
      switch-signal input terminals of a first prescribed number;
      switch-number designating signal input terminals of a second prescribed number; and
      switch-signal accepting means for accepting a switch input signal applied to a predetermined input terminal among said switch-signal input terminals in dependence upon a switch-number designating signal applied to said signal-number designating signal input terminals;
   wherein, said switch unit has:
      switches, the number of said switches being less than said first prescribed number; and
      switch-number designating signal generating means for generating said switch-number designating signal, wherein; said switch number generating signal designates the number of the switches provided on said switch unit and comprises bits the number of said bits being the same as said second prescribed number;
      output signals from the switches of said switch unit and said switch-number designating signal generated by said switch-number designating signal generating means being applied to said terminal device main frame via said connector.

2. A terminal device, comprising:
   switch-signal input terminals of a first prescribed number;
   switch-number designating signal input terminals of a second prescribed number;
   switch-signal accepting means for accepting a switch input signal applied to a predetermined input terminal among said switch-signal input terminals in dependence upon a switch-number designating signal applied to said switch-number designating signal input terminals;
   a switch unit connectable to the terminal device via a connector in a freely attachable and detachable manner;
   switches, the number of said switches being less than said first prescribed number; and
   switch-number designating signal generating means for generating a switch-number designating signal which designates the number of switches provided on said switch unit and which comprises bits the number of said bits being the same as said second prescribed number.

3. A terminal device comprising a terminal device main frame and a switch unit connected thereto by a connector in a freely attachable and detachable manner;
   said switch unit having:
      a prescribed number of switches; and
      switch-number designating signal generating means for generating a switch-number designating signal which designates the number of the switches provided on said switch unit;
   said terminal device main body having:
      switch-signal input terminals the number of which is equal to or greater than said prescribed number;
      switch-number designating signal input terminals; and
      switch signal accepting means for accepting a switch input signal applied to a predetermined input terminal among said switch-signal input terminals in dependence upon a switch-number designating signal applied to said switch-number designating signal input terminals.

4. A switch unit comprising:
   a prescribed number of switches; and
   switch-number signal generating means for generating a signal which represents this prescribed number.

5. A terminal device to which plural kinds of switch units are capable of being connected via a connector common thereto in a freely attachable and detachable manner, said switch unit having switch-number signal generating means which generates a signal representing the number of switches provided on said switch unit, and outputting a switch signal generated by operation of a switch, as well as a switch-number signal generated by said switch-number signal generating means, said terminal device comprising:
   switch-signal input terminals the number of said switch-signal input terminals being equal to or greater than the maximum number of switches provided on each of said plural kinds of switch units;
   switch-number signal input terminals; and
   switch signal accepting means for accepting a switch input signal applied to a predetermined input terminal among said switch-signal input terminals in dependence upon a switch-number signal applied to said switch-number signal input terminals.

* * * * *